(12) United States Patent
Kumagai

(10) Patent No.: US 8,420,507 B2
(45) Date of Patent: Apr. 16, 2013

(54) LASER PROCESSING METHOD

(75) Inventor: Masayoshi Kumagai, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 419 days.

(21) Appl. No.: 12/670,029

(22) PCT Filed: Oct. 27, 2008

(86) PCT No.: PCT/JP2008/069462
§ 371 (c)(1),
(2), (4) Date: Jan. 21, 2010

(87) PCT Pub. No.: WO2009/057558
PCT Pub. Date: May 7, 2009

(65) Prior Publication Data
US 2010/0200550 A1    Aug. 12, 2010

(30) Foreign Application Priority Data
Oct. 30, 2007   (JP) .................................. 2007-282065

(51) Int. Cl.
*H01L 21/301* (2006.01)
(52) U.S. Cl.
USPC ............................ 438/463; 264/400; 264/482
(58) Field of Classification Search ......... 219/121.67–121.72, 121.61, 121.85; 438/463; 264/400, 482
See application file for complete search history.

(56) References Cited

U.S. PATENT DOCUMENTS

| | | | |
|---|---|---|---|
| 4,546,231 A | 10/1985 | Gresser et al. |
| 6,992,026 B2 | 1/2006 | Fukuyo et al. |
| 7,396,742 B2 | 7/2008 | Fukuyo et al. |
| 7,489,454 B2 | 2/2009 | Fukuyo et al. |
| 7,547,613 B2 | 6/2009 | Fukuyo et al. |
| 7,566,635 B2 | 7/2009 | Fujii et al. |
| 7,592,237 B2 | 9/2009 | Sakamoto et al. |
| 7,592,238 B2 | 9/2009 | Fukuyo et al. |

(Continued)

FOREIGN PATENT DOCUMENTS

| | | |
|---|---|---|
| CN | 1160228 A | 9/1997 |
| JP | 2004-343008 | 12/2004 |

(Continued)

OTHER PUBLICATIONS

T. Sano et al., "Evaluation of Processing Characteristics of Silicon with Picosecond Pulse Laser," Preprints of the National Meeting of Japan Welding Society, No. 66, Apr. 2000, pp. 72-73, including English Translation.

(Continued)

*Primary Examiner* — Samuel M Heinrich
(74) *Attorney, Agent, or Firm* — Drinker Biddle & Reath LLP

(57) ABSTRACT

A modified region 7 to become a starting point region for cutting is formed in a GaAs substrate 12 along a line to cut 5 upon radiation with laser light L which is pulsed laser light. As a consequence, the modified region 7 formed in the GaAs substrate 12 along the line to cut 5 is likely to generate fractures in the thickness direction of an object to be processed 1. Therefore, the modified region 7 having an extremely high function as a starting point region for cutting can be formed in the planar object to be processed 1 comprising the GaAs substrate 12.

3 Claims, 20 Drawing Sheets

U.S. PATENT DOCUMENTS

| | | |
|---|---|---|
| 7,605,344 B2 | 10/2009 | Fukumitsu |
| 7,608,214 B2 | 10/2009 | Kuno et al. |
| 7,615,721 B2 | 11/2009 | Fukuyo et al. |
| 7,626,137 B2 | 12/2009 | Fukuyo et al. |
| 7,709,767 B2 | 5/2010 | Sakamoto |
| 7,718,510 B2 | 5/2010 | Sakamoto et al. |
| 7,719,017 B2 | 5/2010 | Tanaka |
| 7,732,730 B2 | 6/2010 | Fukuyo et al. |
| 7,749,867 B2 | 7/2010 | Fukuyo et al. |
| 7,754,583 B2 | 7/2010 | Sakamoto |
| 7,825,350 B2 | 11/2010 | Fukuyo et al. |
| 7,897,487 B2 | 3/2011 | Sugiura et al. |
| 7,902,636 B2 * | 3/2011 | Sugiura et al. ............... 257/617 |
| 7,939,430 B2 | 5/2011 | Sakamoto et al. |
| 7,947,574 B2 | 5/2011 | Sakamoto et al. |
| 2004/0232124 A1 | 11/2004 | Nagai et al. |
| 2005/0173387 A1 | 8/2005 | Fukuyo et al. |
| 2005/0181581 A1 | 8/2005 | Fukuyo et al. |
| 2005/0202596 A1 | 9/2005 | Fukuyo et al. |
| 2005/0272223 A1 | 12/2005 | Fujii et al. |
| 2006/0144828 A1 | 7/2006 | Fukumitsu et al. |
| 2006/0148212 A1 | 7/2006 | Fukuyo et al. |
| 2006/0255024 A1 | 11/2006 | Fukuyo et al. |
| 2007/0085099 A1 | 4/2007 | Fukumitsu et al. |
| 2007/0125757 A1 | 6/2007 | Fukuyo et al. |
| 2007/0158314 A1 | 7/2007 | Fukumitsu et al. |
| 2007/0170159 A1 | 7/2007 | Fukumitsu |
| 2007/0252154 A1 | 11/2007 | Uchiyama et al. |
| 2008/0035611 A1 | 2/2008 | Kuno et al. |
| 2008/0037003 A1 | 2/2008 | Atsumi et al. |
| 2008/0090382 A1 | 4/2008 | Fujii et al. |
| 2008/0218735 A1 | 9/2008 | Atsumi et al. |
| 2008/0251506 A1 | 10/2008 | Atsumi et al. |
| 2009/0008373 A1 | 1/2009 | Muramatsu et al. |
| 2009/0032509 A1 | 2/2009 | Kuno et al. |
| 2009/0098713 A1 | 4/2009 | Sakamoto |
| 2009/0107967 A1 | 4/2009 | Sakamoto et al. |
| 2009/0117712 A1 | 5/2009 | Sakamoto et al. |
| 2009/0166342 A1 | 7/2009 | Kuno et al. |
| 2009/0166808 A1 | 7/2009 | Sakamoto et al. |
| 2009/0236324 A1 | 9/2009 | Fukuyo et al. |
| 2009/0250446 A1 | 10/2009 | Sakamoto |
| 2009/0261083 A1 | 10/2009 | Osajima et al. |
| 2009/0302428 A1 | 12/2009 | Sakamoto et al. |
| 2010/0006548 A1 | 1/2010 | Atsumi et al. |
| 2010/0009547 A1 | 1/2010 | Sakamoto |
| 2010/0012632 A1 | 1/2010 | Sakamoto |
| 2010/0012633 A1 | 1/2010 | Atsumi et al. |
| 2010/0015783 A1 | 1/2010 | Fukuyo et al. |
| 2010/0025386 A1 | 2/2010 | Kuno et al. |
| 2010/0032418 A1 | 2/2010 | Kuno et al. |
| 2010/0055876 A1 | 3/2010 | Fukuyo et al. |
| 2010/0151202 A1 | 6/2010 | Fukumitsu |
| 2010/0176100 A1 | 7/2010 | Fukuyo et al. |
| 2010/0184271 A1 | 7/2010 | Sugiura et al. |
| 2010/0203678 A1 | 8/2010 | Fukumitsu et al. |
| 2010/0203707 A1 | 8/2010 | Fujii et al. |
| 2010/0227453 A1 | 9/2010 | Sakamoto |
| 2010/0240159 A1 | 9/2010 | Kumagai et al. |
| 2010/0258539 A1 | 10/2010 | Sakamoto |
| 2010/0301521 A1 | 12/2010 | Uchiyama |
| 2010/0311313 A1 | 12/2010 | Uchiyama |
| 2010/0327416 A1 | 12/2010 | Fukumitsu |
| 2011/0000897 A1 | 1/2011 | Nakano et al. |
| 2011/0001220 A1 | 1/2011 | Sugiura et al. |
| 2011/0021004 A1 | 1/2011 | Fukuyo et al. |
| 2011/0027971 A1 | 2/2011 | Fukuyo et al. |
| 2011/0027972 A1 | 2/2011 | Fukuyo et al. |
| 2011/0037149 A1 | 2/2011 | Fukuyo et al. |
| 2011/0274128 A1 | 11/2011 | Fukumitsu et al. |

FOREIGN PATENT DOCUMENTS

| | | |
|---|---|---|
| JP | 2005-166728 | 6/2005 |
| JP | 2006-514886 | 5/2006 |
| WO | WO 2006/051866 | 5/2006 |

OTHER PUBLICATIONS

D. Du et al., "Laser-induced breakdown by impact ionization in $SiO_2$ with pulse widths from 7 ns To 150 fs," Appl. Phys. Lett. 64(23), Jun. 6, 1994, pp. 3071-3073.

K. Hayashi, "Inner Glass Marking by Harmonies of Solid State Laser," Proceedings of $45^{th}$ Laser Materials Processing Conference, Dec. 1998, pp. 23-28, including English Abstract.

K. Miura et al., "Formation of Photo-induced Structures in Glasses with Femtosecond Laser," Proceedings of $42^{nd}$ Laser Materials Processing Conference, Nov. 1997, pp. 105-111, including English Abstract.

X. Liu et al., "Laser Ablation and Micromachining with Ultrashort Laser Pulses," IEEE Journal of Quantum Electronics, vol. 33, No. 10, Oct. 1997, pp. 1706-1716.

U.S. Appl. No. 13/206,181, filed Aug. 9, 2011.
U.S. Appl. No. 13/269,274, filed Oct. 7, 2011.
U.S. Appl. No. 13/235,936, filed Sep. 19, 2011.
U.S. Appl. No. 13/213,175, filed Aug. 19, 2011.
U.S. Appl. No. 13/233,662, filed Sep. 15, 2011.
U.S. Appl. No. 13/061,438, filed Apr. 26, 2011.
U.S. Appl. No. 13/107,056, filed May 13, 2011.
U.S. Appl. No. 13/151,877, filed Jun. 2, 2011.
U.S. Appl. No. 13/131,429, filed Jun. 28, 2011.
U.S. Appl. No. 13/143,636, filed Sep. 21, 2011.
U.S. Appl. No. 13/148,097, filed Aug. 26, 2011.
U.S. Appl. No. 13/262,995, filed Oct. 5, 2011.
U.S. Appl. No. 13/265,027, filed Oct. 18, 2011.

* cited by examiner (a)

(b)

(a)

(b)

(a) PHOTOGRAPHS OF SURFACE OF OBJECT

×20 ch.1 ch.2

(b) PHOTOGRAPHS OF CUT SECTIONS OF OBJECT ch.1 ch.2

(a) PHOTOGRAPHS OF SURFACE OF OBJECT

×20     ch.1     ch.2

(b) PHOTOGRAPHS OF CUT SECTIONS OF OBJECT ch.1     ch.2

(a) PHOTOGRAPHS OF SURFACE OF OBJECT

×20 ch.1 × 20 ch.2 × 20

(b) PHOTOGRAPHS OF CUT SECTIONS OF OBJECT ch.1 ch.2

(a) PHOTOGRAPHS OF SURFACE OF OBJECT

×20 ch.1 ×20 ch.2 ×20

(b) PHOTOGRAPHS OF CUT SECTIONS OF OBJECT ch.2 ch.1

(a) PHOTOGRAPHS OF SURFACE OF OBJECT

×20
ch.1 ch.2

(b) PHOTOGRAPHS OF CUT SECTIONS OF OBJECT ch.1 ch.2

LASER PROCESSING METHOD

TECHNICAL FIELD

The present invention relates to a laser processing method for cutting a planar object to be processed comprising a GaAs substrate along a line to cut.

BACKGROUND ART

Known as a conventional laser processing method in the above-mentioned technical field is one irradiating a planar object to be processed comprising an Si substrate with laser while locating a converging point within the object, so as to form a modified region to become a starting point region for cutting in the Si substrate along a line to cut the object (see, for example, Patent Literature 1).
Patent Literature 1: Japanese Patent Application Laid-Open No. 2004-343008

DISCLOSURE OF INVENTION

Technical Problem

However, a technique for forming a modified region which can further improve reliability in cutting has been expected for planar objects to be processed comprising GaAs substrates.

In view of such circumstances, it is an object of the present invention to provide a laser processing method which can form a modified region having a high function as a starting point region for cutting.

Solution to Problem

The inventor conducted diligent studies in order to achieve the above-mentioned object and, as a result, has found that, for forming a modified region having a high function as a starting point region for cutting in a planar object to be processed comprising a GaAs substrate, the pulse width of pulsed laser light irradiating the object is an extremely important parameter. That is, fractures are likely to occur in the thickness direction of the object in modified regions formed in GaAs substrates irradiated with pulsed laser light having a pulse width of 31 to 54 ns. By contrast, fractures are hard to occur in the thickness direction of the object in modified regions formed in GaAs substrates irradiated with pulsed laser light having a pulse width shorter than 31 ns or longer than 54 ns. The inventor further conducted studies based on these findings and has completed the present invention.

Hence, the laser processing method in accordance with the present invention is a laser processing method irradiating a planar object to be processed comprising a GaAs substrate with laser light while locating a converging point within the object, so as to form a modified region to become a starting point region for cutting in the GaAs substrate along a line to cut the object; wherein the laser light is pulsed laser light having a pulse width of 31 to 54 ns.

This laser processing method emits pulsed laser light with a pulse width of 31 to 54 ns, thereby forming a modified region to become a starting point region for cutting in a GaAs substrate along a line to cut. As a consequence, the modified region formed in the GaAs substrate along the line to cut is likely to generate fractures in the thickness direction of the object. Therefore, this laser processing method can form a modified region having a high function as a starting point region for cutting in a planar object to be processed comprising a GaAs substrate.

Preferably, in the laser processing method in accordance with the present invention, the laser light has a pulse pitch of 7.5 to 10 μm. This can form a modified region having a higher function as a starting point region for cutting in the planar object to be processed comprising the GaAs substrate. Here, the pulse pitch of laser light refers to a value obtained by dividing "the scanning rate (moving speed) of the converging point of laser light with respect to the object to be processed" by "the repetition frequency of the pulsed laser light".

Preferably, the laser processing method cuts the object along the line to cut from the modified region acting as a start point after forming the modified region. This can accurately cut the object along the line to cut.

In the laser processing method in accordance with the present invention, the modified region may include a molten processed region.

Advantageous Effects of Invention

The present invention can form a modified region having a high function as a starting point region for cutting in a planar object to be processed comprising a GaAs substrate.

REFERENCE SIGNS LIST

Figure 1:
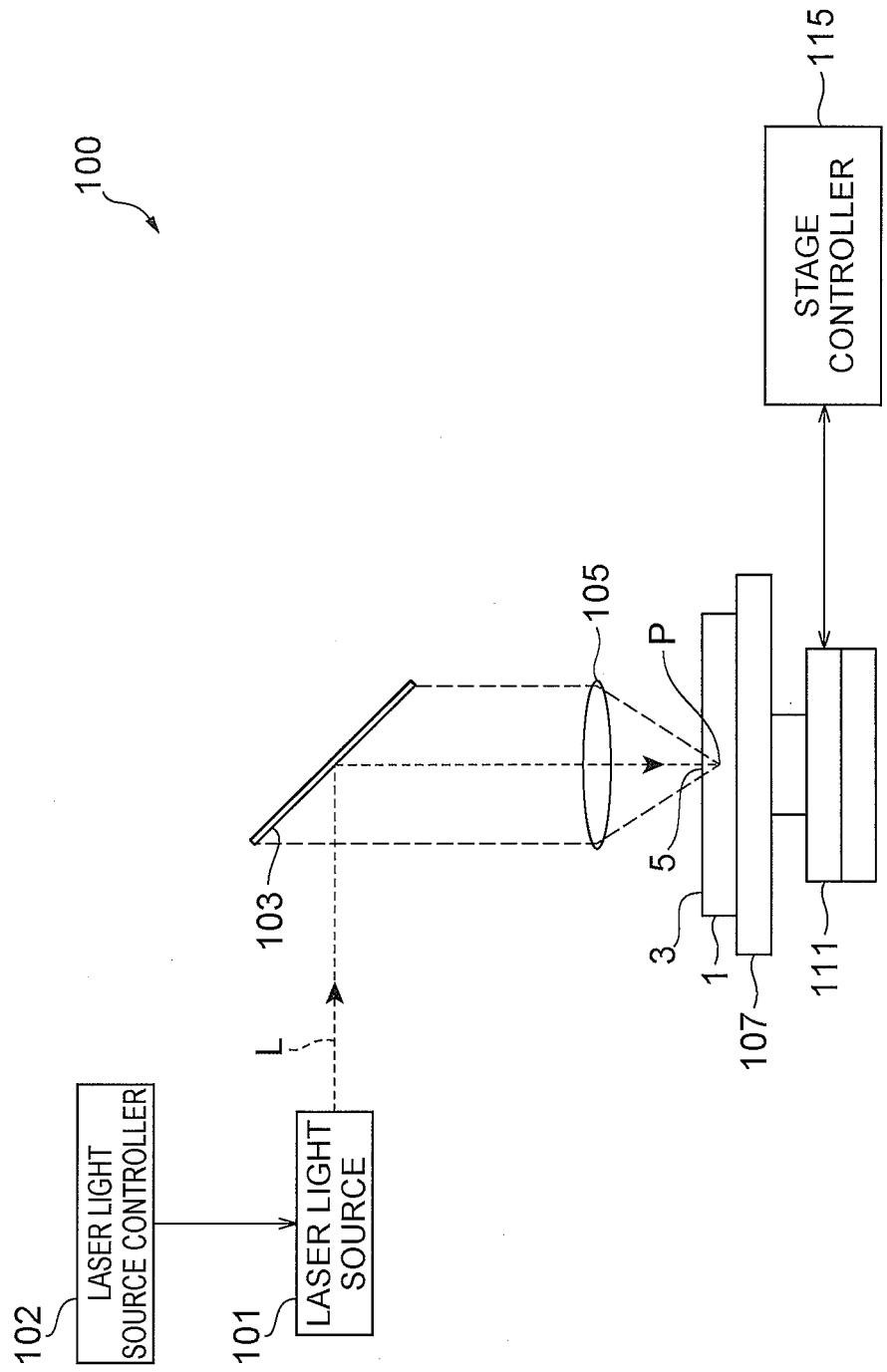
FIG. 1 is a schematic structural diagram of a laser processing apparatus used for forming a modified region.

1 . . . object to be processed; 5 . . . line to cut; 7 . . . modified region; 12 . . . GaAs substrate; 13 . . . molten processed region; L . . . laser light; P . . . converging point

DESCRIPTION OF EMBODIMENTS

In the following, a preferred embodiment of the present invention will be explained in detail with reference to the drawings. In the drawings, the same or equivalent parts will be referred to with the same signs while omitting their overlapping explanations.

The laser processing method in accordance with this embodiment irradiates a planar object to be processed with laser light while locating a converging point at the object, so as to form a modified region in the object along a line to cut the object.

Therefore, to begin with, the forming of a modified region in the laser processing method in accordance with this embodiment will be explained with reference to FIGS. 1 to 9.

As illustrated in FIG. 1, a laser processing apparatus 100 comprises a laser light source 101 for pulsatingly oscillating laser light (processing laser light) L, a dichroic mirror 103 arranged such as to change the direction of the optical axis of the laser light L by 90°, and a condenser lens 105 for converging the laser light L. The laser processing apparatus 100 further comprises a support table 107 for supporting an object to be processed 1 which is irradiated with the laser light L converged by the condenser lens 105, a stage 111 for moving the support table 107 along X, Y, and Z axes, a laser light source controller 102 for regulating the laser light source 101 in order to adjust the output, pulse width, and the like of the laser light L, and a stage controller 115 for regulating movements of the stage 111.

In the laser processing apparatus 100, the laser light L emitted from the laser light source 101 changes the direction of its optical axis by 90° with the dichroic mirror 103, and then is converged by the condenser lens 105 into the object 1 on the support table 107. At the same time, the stage 111 is shifted, so that the object 1 is moved relative to the laser light L along a line to cut 5. As a consequence, a modified region to become a starting point region for cutting is formed in the object 1 along the line to cut 5. This modified region will be explained in detail in the following.

Figure 2:
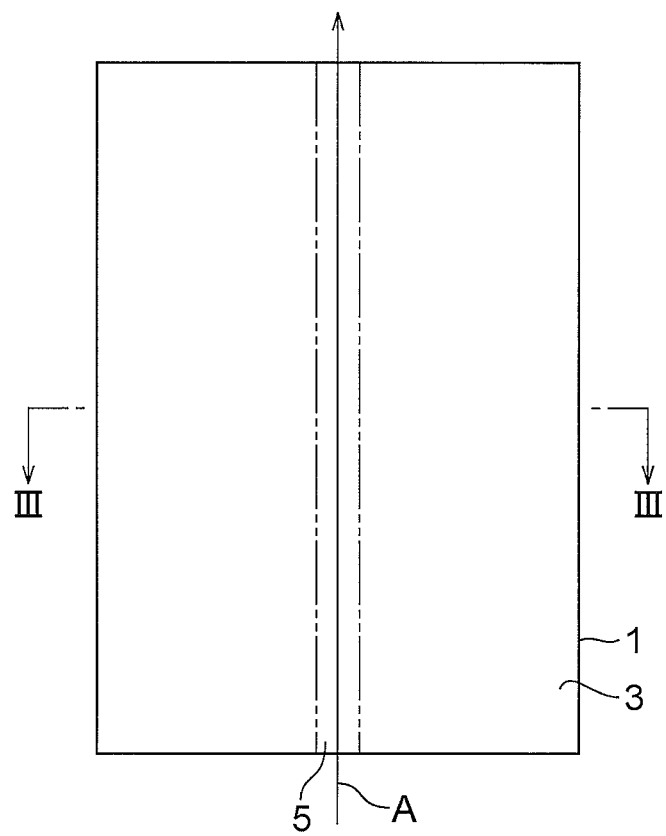
FIG. 2 is a plan view of an object to be processed for which the modified region is formed.
Figure 3:
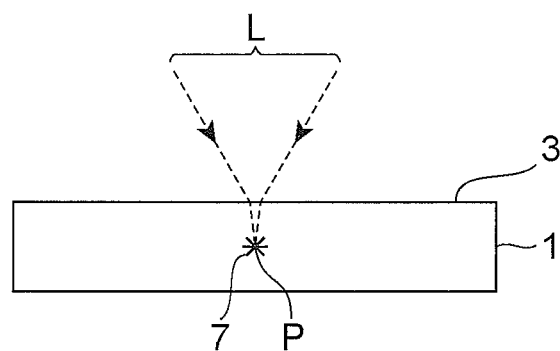
FIG. 3 is a sectional view of the object taken along the line III-III of FIG. 2.
Figure 4:
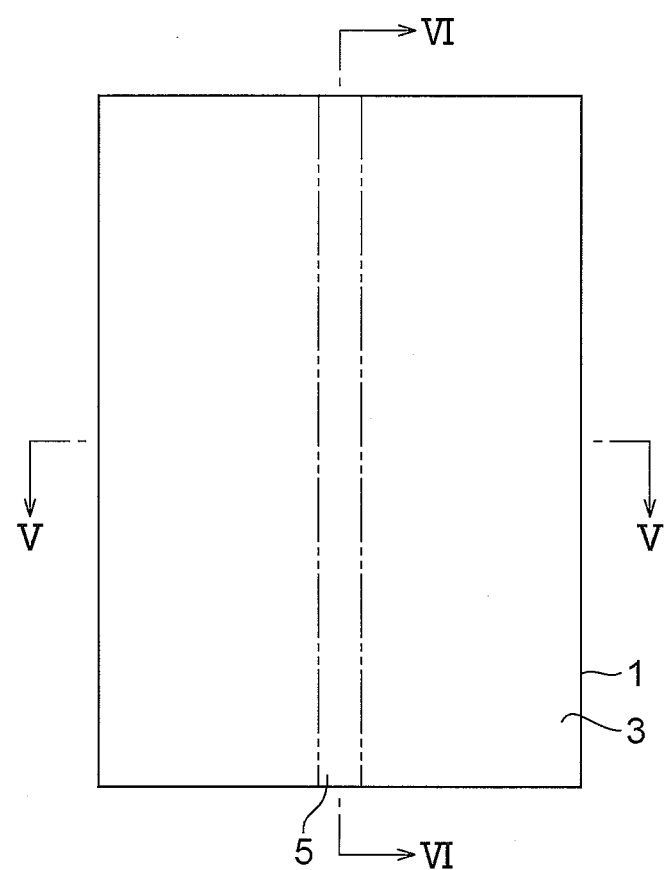
FIG. 4 is a plan view of the object after laser processing.
Figure 5:
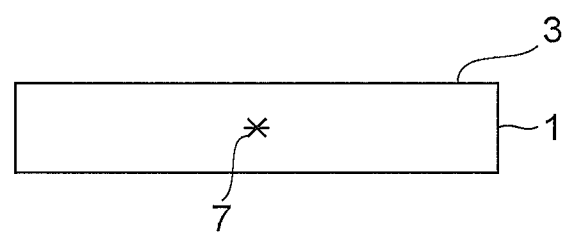
FIG. 5 is a sectional view of the object taken along the line V-V of FIG. 4.
Figure 6:
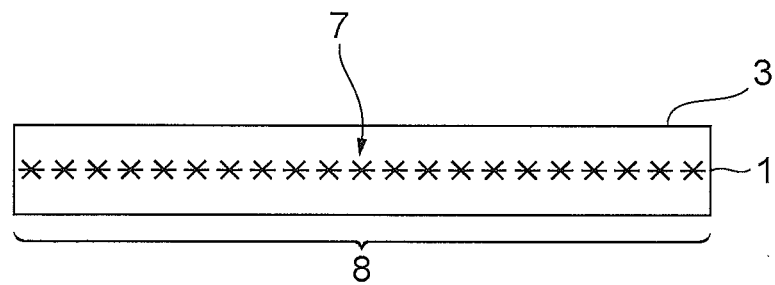
FIG. 6 is a sectional view of the object taken along the line VI-VI of FIG. 4.

As illustrated in FIG. 2, the line to cut 5 for cutting the planar object 1 is set therein. The line to cut 5 is a virtual line extending straight. When forming a modified region within the object 1, the laser light L is relatively moved along the line to cut 5 (i.e., in the direction of arrow A in FIG. 2) while locating a converging point P within the object 1 as illustrated in FIG. 3. This forms a modified region 7 within the object 1 along the line to cut 5 as illustrated in FIGS. 4 to 6, whereby the modified region 7 formed along the line to cut 5 becomes a starting point region for cutting 8.

The converging point P is a position at which the laser light L is converged. The line to cut 5 may be curved instead of being straight, and may be a line actually drawn on the front face 3 of the object 1 without being restricted to the virtual line. The modified region 7 may be formed either continuously or intermittently. It will be sufficient if the modified region 7 is formed at least within the object 1. There are cases where fractures are formed from the modified region acting as a start point, and the fractures and modified region may be exposed at outer surfaces (the front face, rear face, and outer peripheral face) of the object 1.

Here, the laser light L is absorbed in particular in the vicinity of the converging point within the object 1 while being transmitted therethrough, whereby the modified region 7 is formed in the object 1 (i.e., internal absorption type laser processing). Therefore, the front face 3 of the object 1 hardly absorbs the laser light L and thus does not melt. In the case of forming a removing part such as a hole or groove by melting it away from the front face 3 (i.e., surface absorption type laser processing), the processing region gradually progresses from the front face 3 side to the rear face side in general.

The modified region formed by the laser processing method in accordance with this embodiment refers to regions whose physical characteristics such as density, refractive index, and mechanical strength have attained states different from those of their surroundings. Examples of the modified region include (1) molten processed regions, (2) crack regions or dielectric breakdown regions, (3) refractive index changed regions, and their mixed regions.

The modified region in the laser processing method in accordance with this embodiment can be formed by local absorption of laser light or a phenomenon known as multiphoton absorption. A material becomes transparent when its absorption bandgap $E_G$ is greater than photon energy hv, so that a condition under which absorption occurs in the material is $hv > E_G$. However, even when optically transparent, the material generates absorption under a condition of $nhv > E_G$ (where n=2, 3, 4, . . . ) if the intensity of laser light becomes very high. This phenomenon is known as multiphoton absorption. The forming of a molten processed region by multiphoton absorption is disclosed, for example, in "Silicon Processing Characteristic Evaluation by Picosecond Pulse Laser", Preprints of the National Meetings of Japan Welding Society, Vol. 66 (April, 2000), pp. 72-73.

Also, modified regions formed by employing ultrashort-pulsed laser light having a pulse width of several picoseconds to femtoseconds may be utilized as described in D. Du, X. Liu, G. Korn, J. Squier, and G. Mourou, "Laser Induced Breakdown by Impact Ionization in $SiO_2$ with Pulse Widths from 7 ns to 150 fs", Appl. Phys. Lett. 64(23), Jun. 6, 1994.

(1) Case where the Modified Region Includes a Molten Processed Region

An object to be processed (e.g., semiconductor material such as silicon) is irradiated with the laser light L while locating a converging point within the object under a condition with a field intensity of at least $1 \times 10^8$ (W/cm$^2$) at the converging point and a pulse width of 1 μs or less. As a consequence, the laser light L is absorbed in the vicinity of the converging point, so that the inside of the object is locally heated, and this heating forms a molten processed region within the object.

The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object to be processed is of a silicon monocrystal structure, the molten processed region is an amorphous silicon structure, for example.

Figure 7:
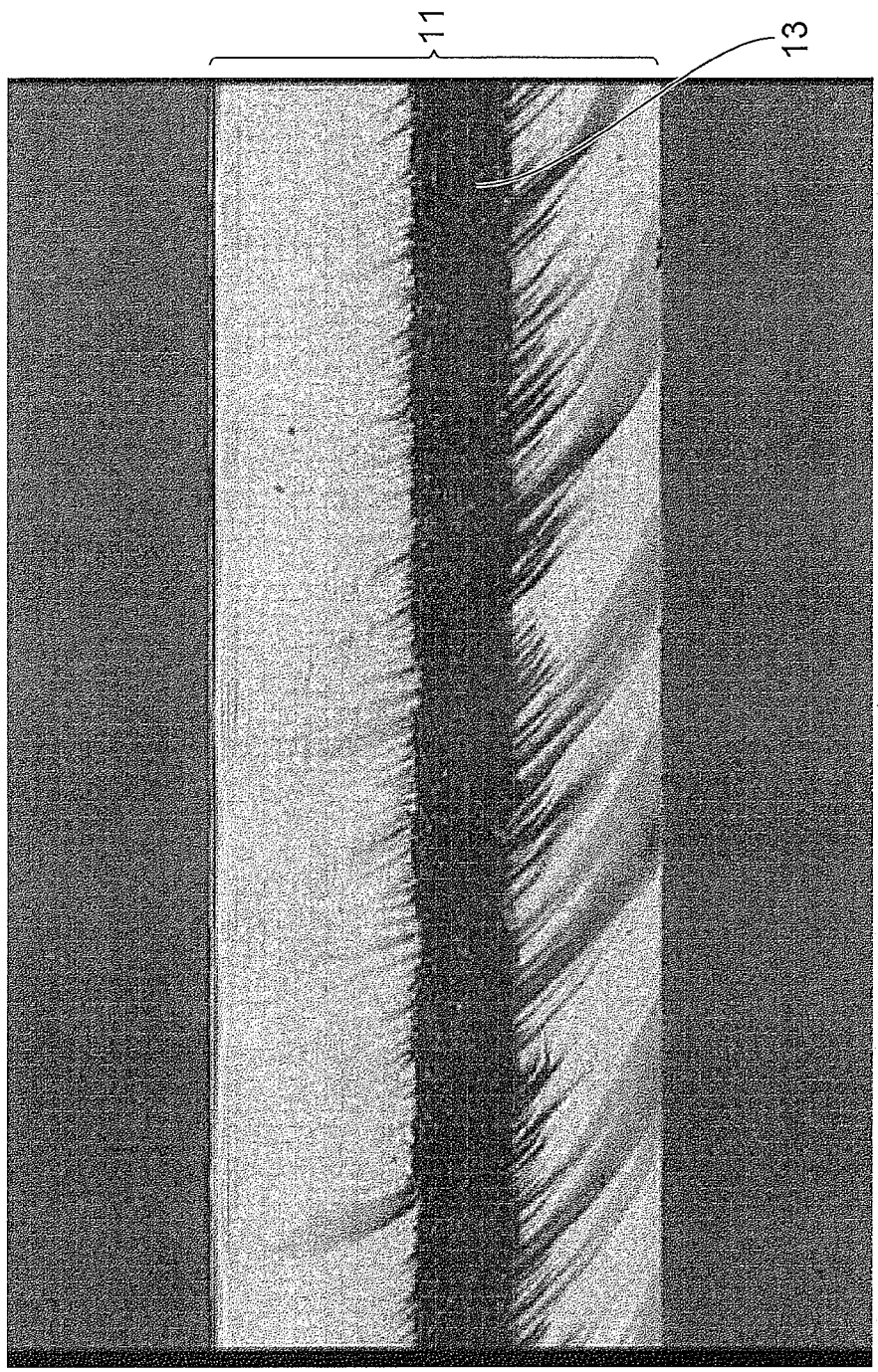
FIG. 7 is a view illustrating a photograph of a cut section of a silicon wafer after laser processing.

FIG. 7 is a view illustrating a photograph of a cross section in a part of a silicon wafer (semiconductor substrate) irradiated with laser light. As illustrated in FIG. 7, a molten processed region 13 is formed within a semiconductor substrate 11.

Figure 8:
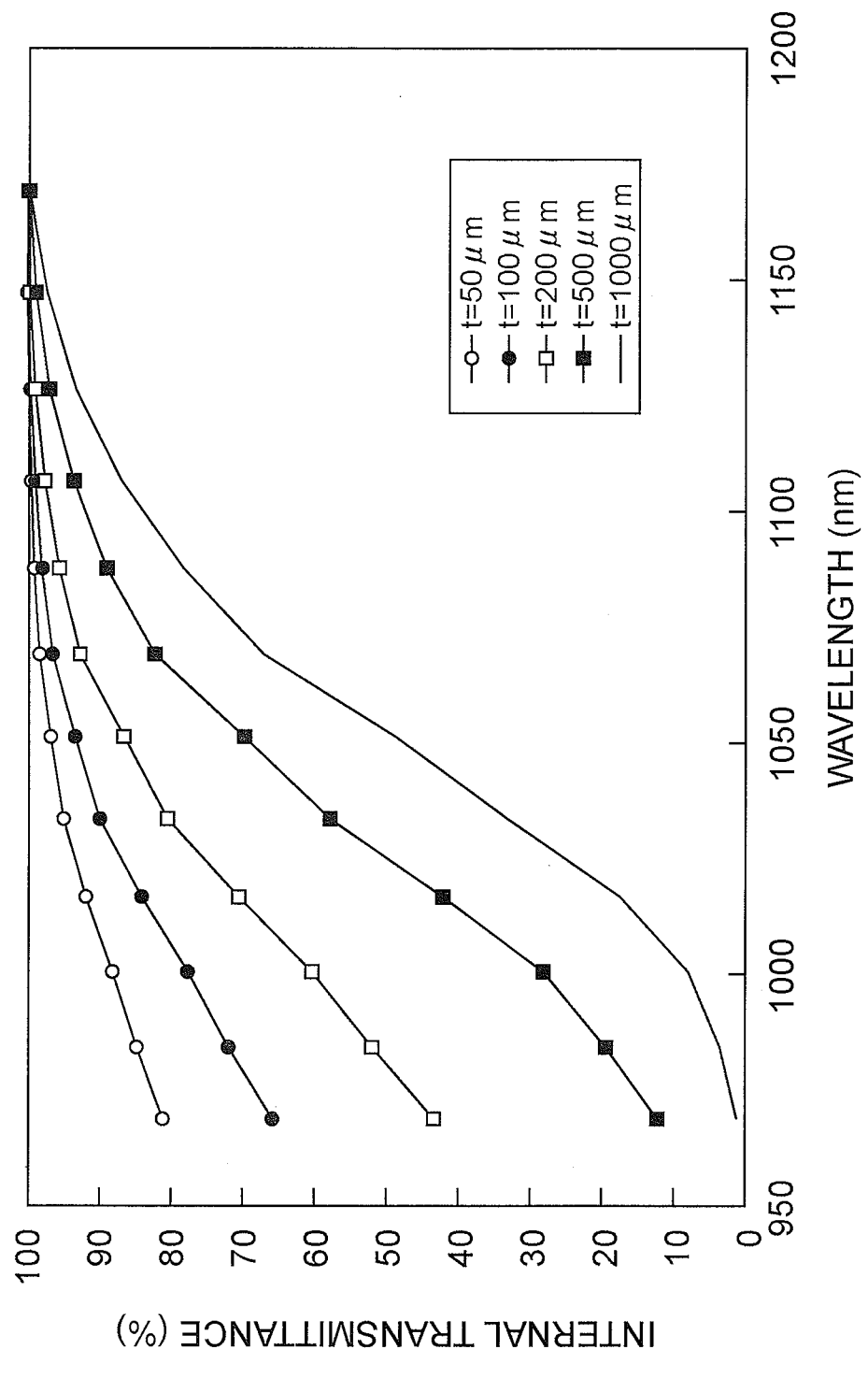
FIG. 8 is a graph illustrating relationships between the laser light wavelength and the transmittance within a silicon substrate.

The fact that the molten processed region 13 is formed within a material transparent to the wavelength of laser light incident thereon will now be explained. FIG. 8 is a graph illustrating relationships between the laser light wavelength and the transmittance within the silicon substrate. Here, the respective reflected components on the front and rear face sides of the silicon substrate are eliminated, so as to indicate the internal transmittance alone. The respective relationships are represented in the cases where the thickness t of the silicon substrate is 50 μm, 100 μm, 200 μm, 500 μm, and 1000 μm.

For example, at the Nd:YAG laser wavelength of 1064 nm, the laser light L appears to be transmitted through the silicon substrate by at least 80% when the silicon substrate has a thickness of 500 μm or less. Since the semiconductor substrate 11 represented in FIG. 7 has a thickness of 350 μm, the molten processed region 13 caused by multiphoton absorption is formed near the center of the semiconductor substrate 11, i.e., at a part distanced from the front face by 175 μm. The transmittance in this case is 90% or more with reference to a silicon wafer having a thickness of 200 μm, whereby the laser light L is absorbed only slightly within the semiconductor substrate 11 but is substantially transmitted therethrough. When converged within the silicon wafer under the condition of at least $1 \times 10^8$ (W/cm$^2$) with a pulse width of 1 μs or less, however, the laser light L is locally absorbed at the converging point and its vicinity, whereby the molten processed region 13 is formed within the semiconductor substrate 11.

There is a case where fractures occur in the silicon wafer from the molten processed region acting as a start point. There is also a case where fractures are formed as being incorporated in the molten processed region. In the latter case, the fractures may be formed over the whole surface of the molten processed region or in only a part or a plurality of parts thereof. These fractures may grow naturally or as a force is exerted on the silicon wafer. The fractures naturally growing from the molten processed region include both of cases where they grow from a state in which the molten processed region is molten and where they grow when the molten processed region is re-solidified from the molten state. In either case, the molten processed region is formed only within the silicon wafer and, when at a cut section, within the cut section as illustrated in FIG. 7.

(2) Case where the Modified Region Includes a Crack Region

An object to be processed (e.g., glass or a piezoelectric material made of LiTaO$_3$) is irradiated with the laser light L while locating a converging point therewithin under a condition with a field intensity of at least $1 \times 10^8$ (W/cm$^2$) at the converging point and a pulse width of 1 μs or less. This magnitude of pulse width is a condition under which the laser light L is absorbed within the object so that a crack region is formed therein. This generates a phenomenon of optical damage within the object. This optical damage induces a thermal distortion within the object, thereby forming a crack region including a crack or a plurality of cracks within the object. The crack region may also be referred to as a dielectric breakdown region.

Figure 9:
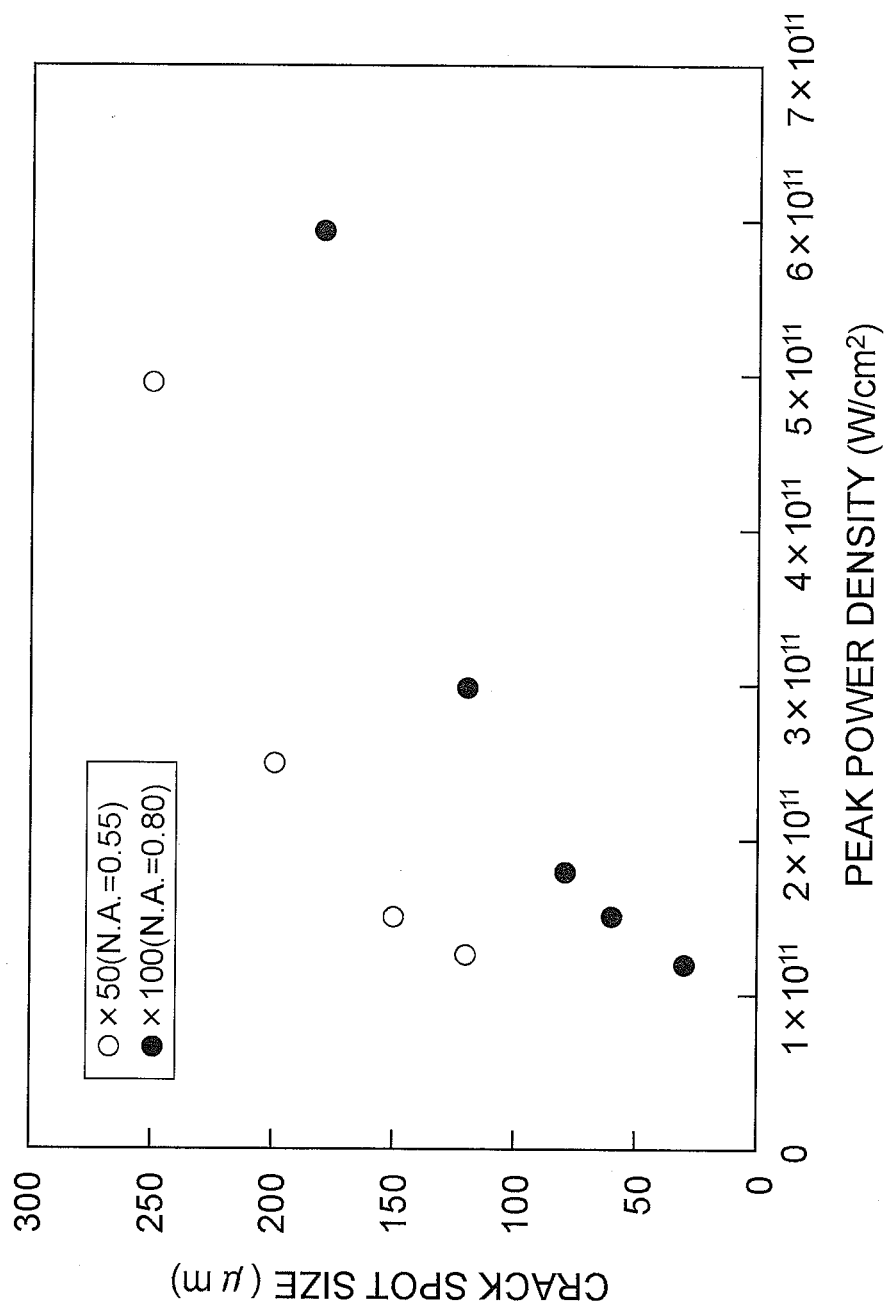
FIG. 9 is a graph illustrating relationships between the peak power density of laser light and crack spot size.

FIG. 9 is a graph illustrating results of experiments concerning relationships between the field intensity and crack size. The abscissa indicates the peak power density. Since the laser light L is pulsed laser light, the field intensity is represented by the peak power density. The ordinate indicates the size of a crack part (crack spot) formed within the object by one pulse of laser light L. Crack spots gather to yield a crack region. The crack spot size is the size of a part yielding the maximum length among forms of crack spots. Data represented by black circles in the graph refer to a case where the condenser lens (C) has a magnification of ×100 and a numerical aperture (NA) of 0.80. On the other hand, data represented by whitened circles in the graph refer to a case where the condenser lens (C) has a magnification of ×50 and a numerical aperture (NA) of 0.55. Crack spots are seen to occur within the object from when the peak power density is about $10^{11}$ (W/cm$^2$) and become greater as the peak power density increases.

(3) Case where the Modified Region Includes a Refractive Index Changed Region

An object to be processed (e.g., glass) is irradiated with the laser light L while locating a converging point within the object under a condition with a field intensity of at least $1 \times 10^8$ (W/cm$^2$) at the converging point and a pulse width of 1 ns or less. When the laser light L is thus absorbed within the object while having a very short pulse width, its energy is not converted into thermal energy, whereby an eternal structure change such as ion valence change, crystallization, or orientation polarization is induced within the object, thus forming a refractive index changed region.

The modified region, which encompasses the molten processed regions, dielectric breakdown regions, refractive index changed regions, and their mixed regions, may be an area where the density of the modified region has changed from that of an unmodified region in the material or an area formed with a lattice defect. They can collectively be referred to as a high-density transitional region.

The molten processed regions, refractive index changed regions, areas where the modified region has a density different from that of the unmodified region, or areas formed with a lattice defect may further incorporate a fracture (cut or microcrack) therewithin or at an interface between the modified and unmodified regions. The incorporated fracture may be formed over the whole surface of the modified region or in only a part or a plurality of parts thereof.

The object can be cut with a favorable precision if the modified region is formed as follows while taking account of the crystal structure of the object, its cleavage characteristic, and the like.

That is, in the case of a substrate made of a monocrystal semiconductor having a diamond structure such as silicon, it will be preferred if the modified region is formed in a direction extending along a (111) plane (first cleavage plane) or a (110) plane (second cleavage plane). In the case of a substrate made of a group III-V compound semiconductor of sphalerite structure such as GaAs, it will be preferred if the modified region is formed in a direction extending along a (110) plane. In the case of a substrate having a crystal structure of hexagonal system such as sapphire (Al$_2$O$_3$), it will be preferred if the modified region is formed in a direction extending along a (1120) plane (A plane) or a (1100) plane (M plane) while using a (0001) plane (C plane) as a principal plane.

When the substrate is formed with an orientation flat in a direction to be formed with the above-mentioned modified region (e.g., a direction extending along a (111) plane in a monocrystal silicon substrate) or a direction orthogonal to the direction to be formed therewith, the modified region can be formed easily and accurately in the substrate with reference to the orientation flat.

The laser processing method in accordance with this embodiment will now be explained.

Figure 10:
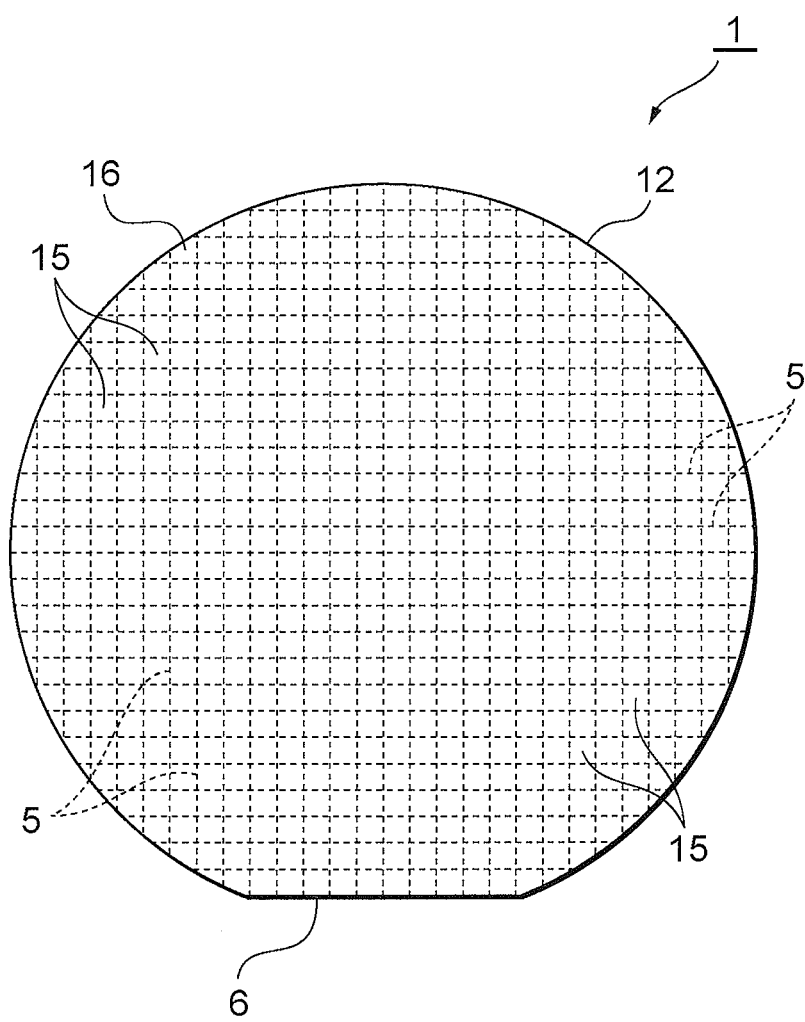
FIG. 10 is a plan view of an object to be processed to which the laser processing method in accordance with an embodiment is applied.
Figure 11:
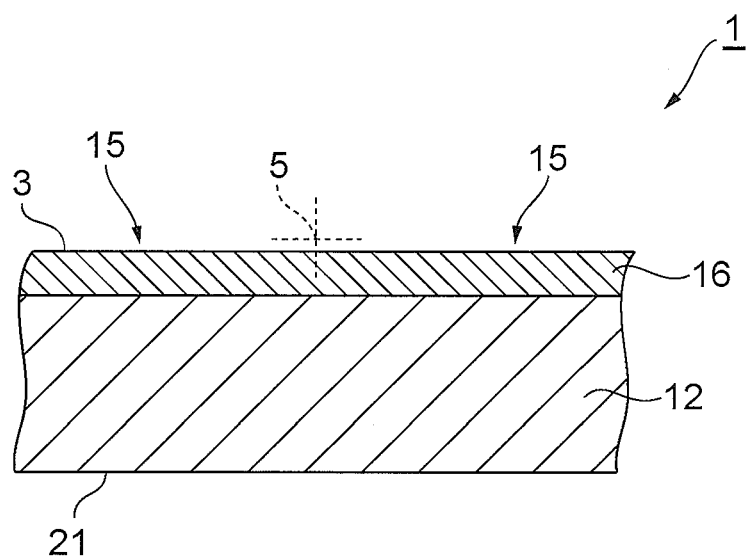
FIG. 11 is a partial sectional view of the object of FIG. 10 taken along a line to cut.

FIG. 10 is a plan view of an object to be processed to which the laser processing method in accordance with this embodiment is applied, while FIG. 11 is a partial sectional view of the object taken along a line to cut in FIG. 10. As illustrated in FIGS. 10 and 11, the planar object to be processed 1 comprises a GaAs substrate 12 and a functional device layer 16 which is formed on a main face of the GaAs substrate 12 while including a plurality of functional devices 15. The GaAs substrate 12 has a sphalerite structure, in which, when the main face is taken as a (100) surface, a surface parallel to an orientation flat 6 is a (011) or (0-1-1) surface, and a surface perpendicular to the orientation flat 6 is a (0-11) or (01-1) surface. A number of functional devices 15, examples of which include semiconductor operating layers formed by crystal growth, light-receiving devices such as photodiodes, light-emitting devices such as laser diodes, and circuit devices formed as circuits, are formed like a matrix in directions parallel and perpendicular to the orientation flat 6 of the GaAs substrate 12.

The laser processing method in accordance with this embodiment is applied to thus constructed object 1.

Figure 12:
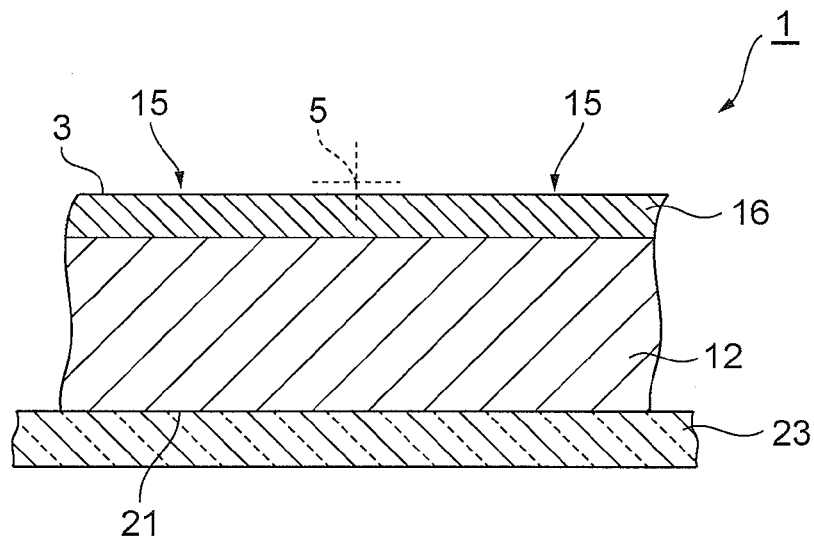
FIG. 12 is a partial sectional view of the object for explaining the laser processing method in accordance with the embodiment.
Figure 12:
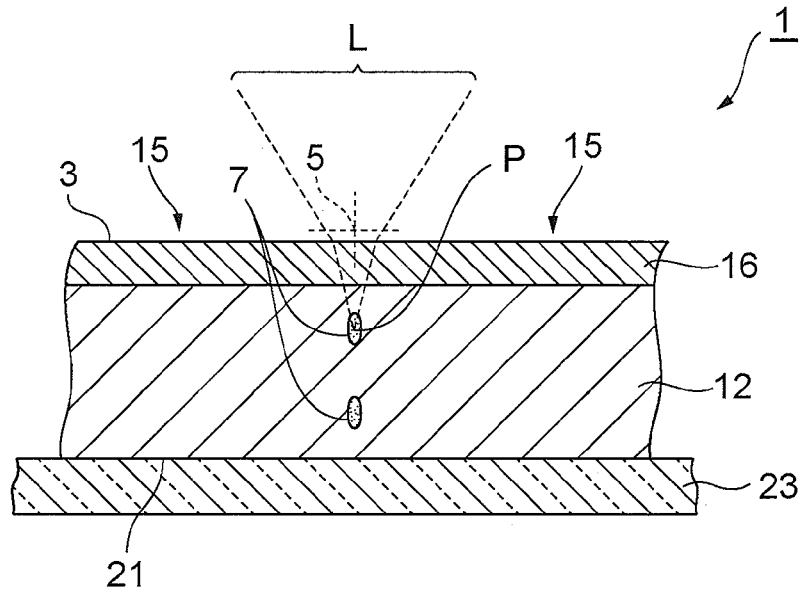

First, as illustrated in FIG. 12(a), an expandable tape 23 is attached to the rear face 21 of the object 1. Subsequently, the object 1 is secured onto a support table (not depicted) of the laser processing apparatus such that the functional device layer 16 faces up. Then, as illustrated in FIG. 10, lines to cut 5 are set like grids passing between adjacent functional devices 15, 15 in directions perpendicular and parallel to the orientation flat 6.

Next, as illustrated in FIG. 12(b), the object 1 is irradiated with the laser light L while using the front face 3 as a laser light entrance surface and locating the converging point P within the GaAs substrate 12, and the support table is moved, so as to shift the converging point P relatively along the lines to cut 5 set like grids in the directions perpendicular and parallel to the orientation flat 6. Here, the laser light L is pulsed laser light which is emitted with a pulse width of 31 to 54 ns and a pulse pitch of 7.5 to 10 μm.

The converging point P is relatively moved along each line to cut 5 a plurality of times (e.g., two times) with respective distances from the surface 3 to the position where the converging point P is located, whereby a plurality of rows of modified regions 7 are formed within the GaAs substrate 12 with respect to each line to cut 5 one by one in order from the rear face 21 side. The number of rows of modified regions 7 formed within the GaAs substrate 12 for each line to cut 5 is variable depending on the thickness of the GaAs substrate 12 and the like and may be 1 without being restricted to plurals.

Figure 13:
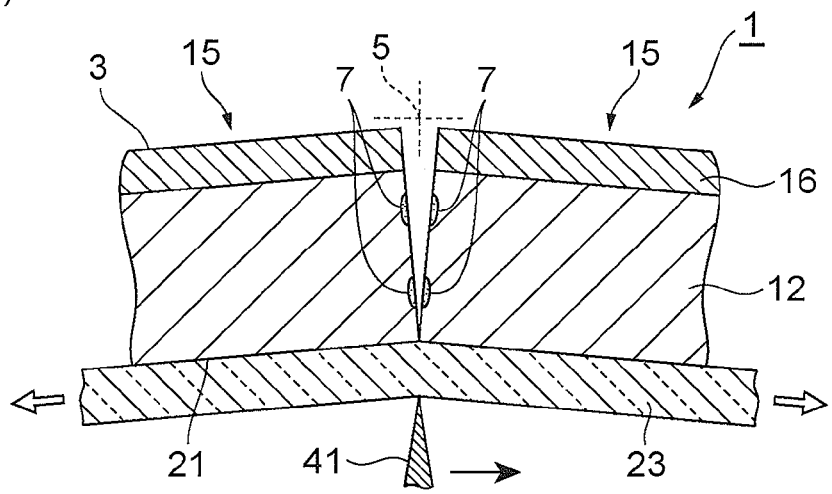
FIG. 13 is a partial sectional view of the object for explaining the laser processing method in accordance with the embodiment.
Figure 13:
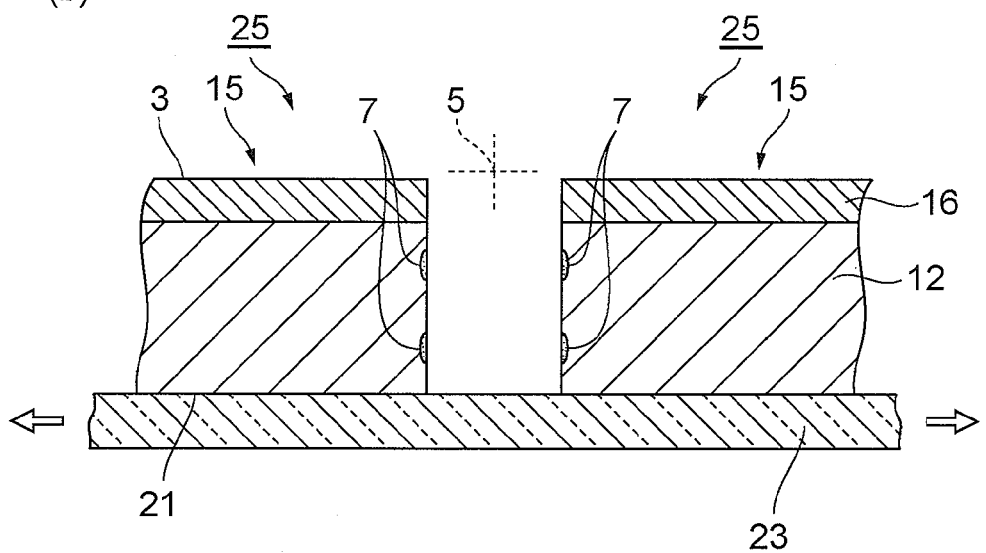

Subsequently, as illustrated in FIG. 13(a), the expandable tape 23 is expanded. As the expandable tape expands, the object 1 is stretched, so as to be cut into chips from the modified regions 7 acting as start points, whereby a number of semiconductor chips 25 each having one functional device 15 are obtained. Since the expandable tape 23 is in an expanded state at this time, the semiconductor chips 25 are separated from each other as illustrated in FIG. 13(b).

As explained in the foregoing, the laser processing method in accordance with this embodiment emits the laser light L at a pulse width of 31 to 54 ns and a pulse pitch of 7.5 to 10 μm, so as to form the modified regions 7 to become starting point regions for cutting in the GaAs substrate 12 along the lines to cut 5. As a consequence, the modified regions 7 formed in the GaAs substrate 12 along the lines to cut 5 become those which are likely to generate fractures in the thickness direction of the object 1. Therefore, the laser processing method in accordance with this embodiment can form the modified regions 7 having an extremely high function as a starting point region for cutting in the planar object 1 comprising the GaAs substrate 12.

The laser processing method in accordance with this embodiment forms the modified regions 7 having an extremely high function as a starting point region for cutting and then cuts the object 1 along the line to cut 5 from the modified regions 7 acting as start points, and thus can achieve an extremely high cutting accuracy.

The modified regions 7 formed in the laser processing method in accordance with this embodiment include molten processed regions. Fractures starting from the forming of modified regions and contributing to cutting are accurately formed on a surface on a side opposite to the laser light entrance surface.

Results of experiments with laser processing methods in accordance with examples and comparative examples will now be explained.

Table 1 lists laser light irradiation conditions and respective division ratios under the irradiation conditions. In Table 1, "pulse width" refers to the pulse width of pulsed laser light. "Pulse pitch" indicates the interval with which converging points of the pulsed laser light are formed. "Division ratio" is a ratio at which chips each having an outer shape of 1 mm×1 mm were actually obtained when an object to be processed occupying ¼ of a GaAs substrate having an outer diameter of 2 inches and a thickness of 100 μm was irradiated with the pulsed laser light under the irradiation conditions and processing conditions which will be explained later so as to be divided into the chips each having an outer shape of 1 mm×1 mm.

TABLE 1

| Condition | Frequency [kHz] | Pulse width [ns] | Scanning rate [mm/s] | Pulse pitch [μm] | Division ratio [%] |
| --- | --- | --- | --- | --- | --- |
| 1 | 30 | 13 | 225 | 7.5 | 40 |
| 2 | 5 | 31 | 25 | 5 | 0 |
| 3 | 5 | 31 | 37.5 | 7.5 | 100 |
| 4 | 5 | 31 | 50 | 10 | 100 |
| 5 | 5 | 31 | 62.5 | 12.5 | 92.1 |
| 6 | 5 | 31 | 75 | 15 | 79.2 |
| 7 | 10 | 41 | 50 | 5 | 0 |
| 8 | 10 | 41 | 75 | 7.5 | 96.8 |
| 9 | 10 | 41 | 100 | 10 | 99 |
| 10 | 10 | 41 | 125 | 12.5 | 93.5 |
| 11 | 10 | 41 | 150 | 15 | 79.3 |
| 12 | 10 | 48 | 50 | 5 | 8.3 |
| 13 | 10 | 48 | 75 | 7.5 | 99 |
| 14 | 10 | 48 | 100 | 10 | 99.2 |
| 15 | 10 | 48 | 125 | 12.5 | 100 |
| 16 | 10 | 48 | 150 | 15 | 82.5 |
| 17 | 10 | 54 | 50 | 5 | 1 |
| 18 | 10 | 54 | 75 | 7.5 | 100 |
| 19 | 10 | 54 | 100 | 10 | 91.7 |
| 20 | 10 | 54 | 125 | 12.5 | 75.8 |
| 21 | 10 | 61 | 50 | 5 | 0 |

TABLE 1-continued

| Condition | Frequency [kHz] | Pulse width [ns] | Scanning rate [mm/s] | Pulse pitch [µm] | Division ratio [%] |
|---|---|---|---|---|---|
| 22 | 10 | 61 | 75 | 7.5 | 87.5 |
| 23 | 10 | 61 | 100 | 10 | 81.7 |
| 24 | 10 | 61 | 125 | 12.5 | 4.2 |

The following are other processing conditions. The object to be processed, which was a ¼ portion of a GaAs substrate having an outer diameter of 2 inches and a thickness of 100 µm, was irradiated with the laser light converged at a position distanced by 70 µm from the front face that is the laser light entrance surface thereof (whereby a modified region was formed at a position ranging from 57 to 70 µm from the laser light entrance surface) and then with the laser light converged at a position distanced by 40 µm from the front face that is the laser light entrance surface thereof (whereby a modified region was formed at a position ranging from 33 to 48 µm from the laser light entrance surface), so that two rows of modified regions were formed for each line to cut. When forming the modified region at the position distanced by 70 µm from the front face of the object, the laser light had a converged diameter of 0.86 µm and an energy density of $1.20 \times 10^7$ (W/cm$^2$) at the converging point. When forming the modified region at the position distanced by 40 µm from the front face of the object, the laser light had a converged diameter of 0.86 µm and an energy density of $9.64 \times 10^6$ (W/cm$^2$) at the converging point. After forming the modified regions, the expandable tape was expanded by an amount of expansion of 15 mm and an expanding rate of 10 mm/s over the whole rear face of the object.

Figure 14:
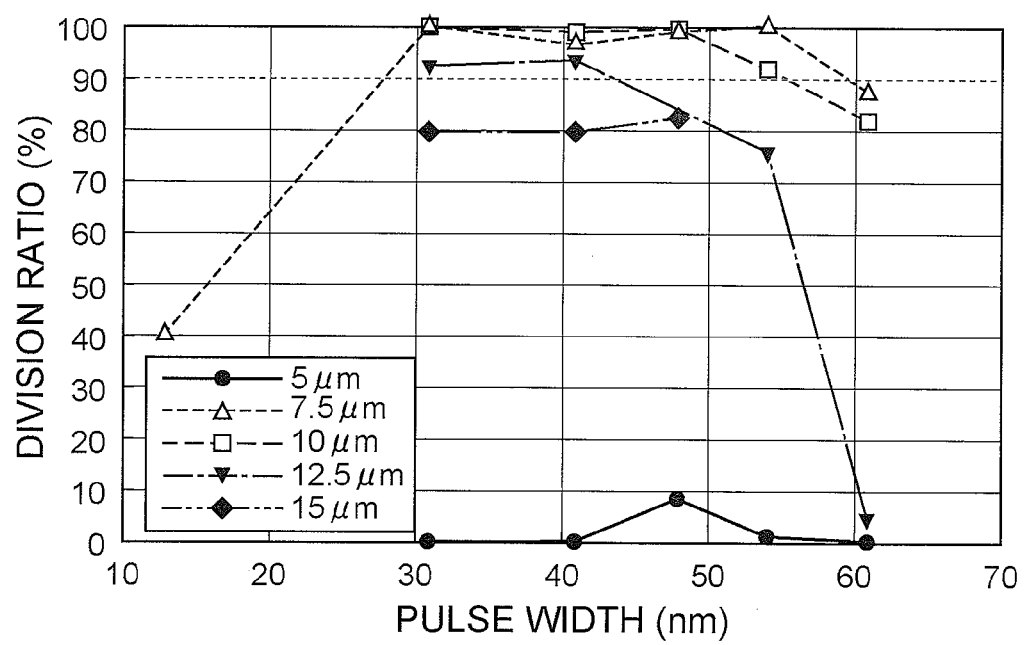
FIG. 14 is a graph illustrating relationships between the pulse width and division ratio when laser processing methods in accordance with examples and comparative examples were performed.
Figure 15:
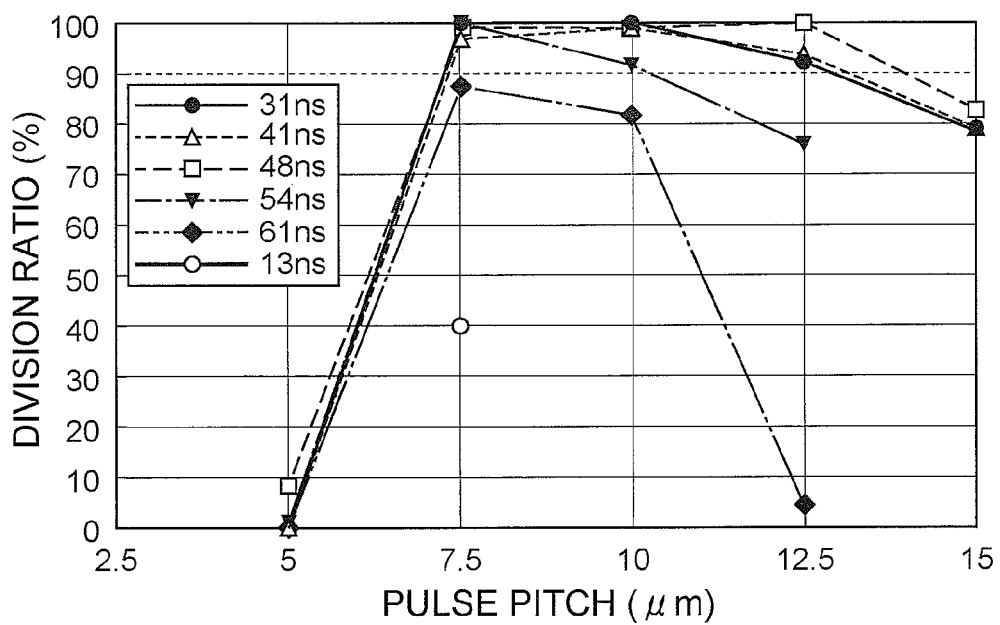
FIG. 15 is a graph illustrating relationships between the pulse pitch and division ratio when laser processing methods in accordance with examples and comparative examples were performed.
Figure 16:
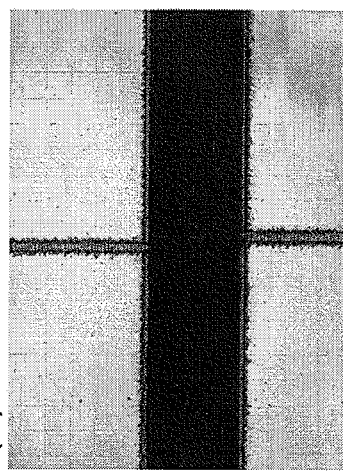
FIG. 16 is a view illustrating photographs of a surface and cut sections of the object after division in the case of condition 7 in Table 1.
Figure 16:
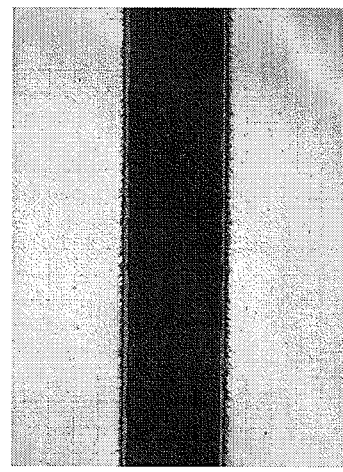
Figure 16:
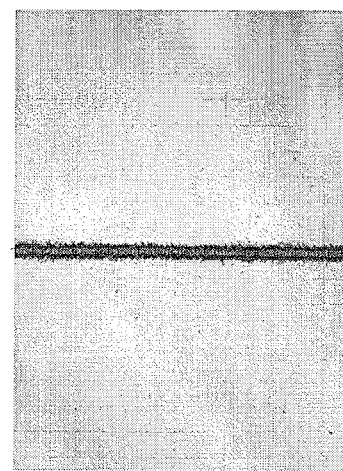
Figure 16:
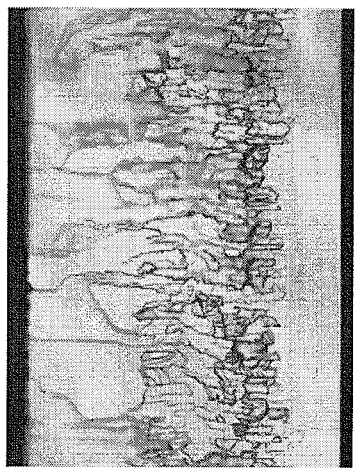
Figure 16:
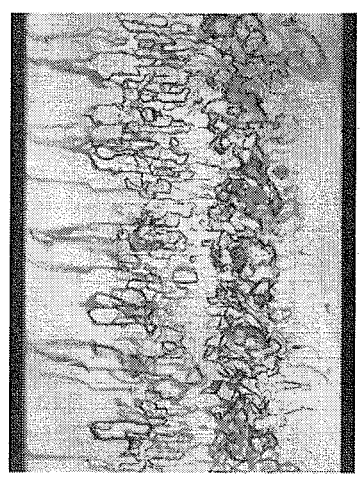
Figure 17:
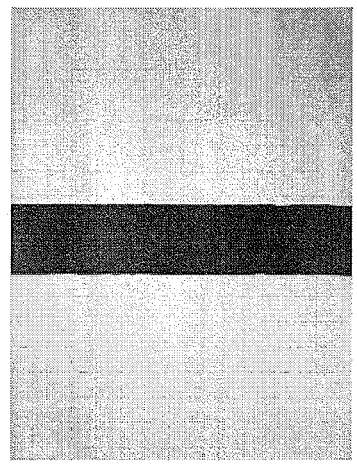
FIG. 17 is a view illustrating photographs of a surface and cut sections of the object after division in the case of condition 8 in Table 1.
Figure 17:
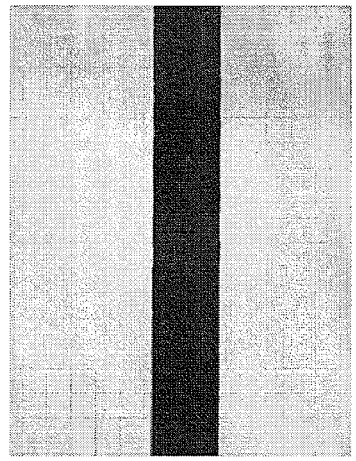
Figure 17:
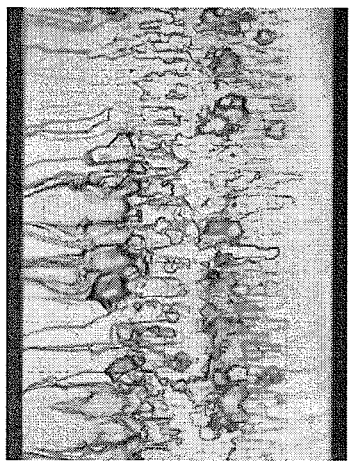
Figure 17:
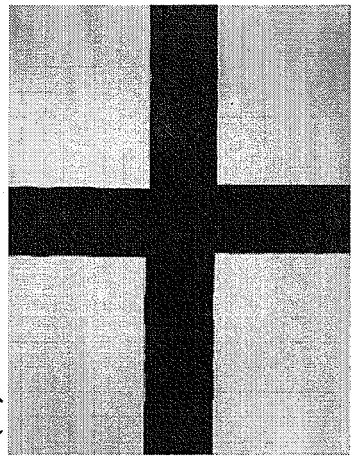
Figure 17:
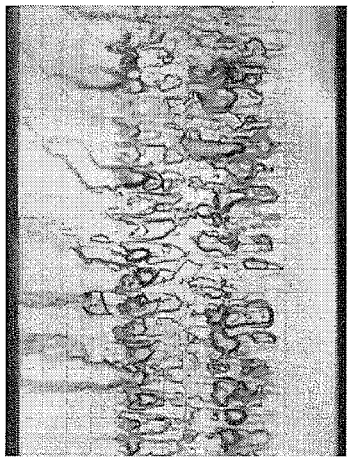
Figure 18:
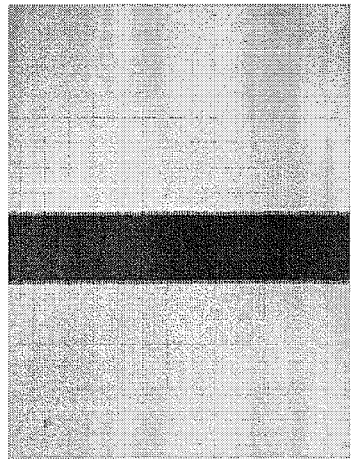
FIG. 18 is a view illustrating photographs of a surface and cut sections of the object after division in the case of condition 9 in Table 1.
Figure 18:
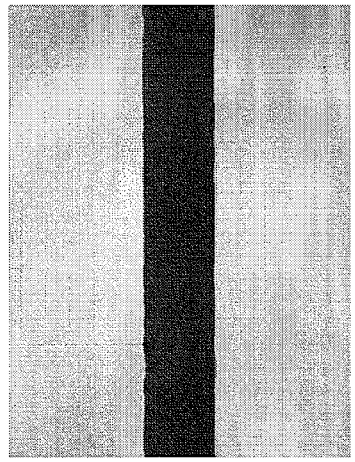
Figure 18:
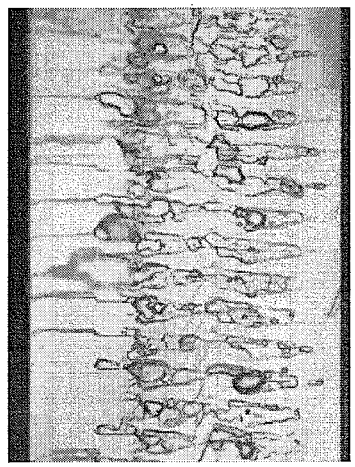
Figure 18:
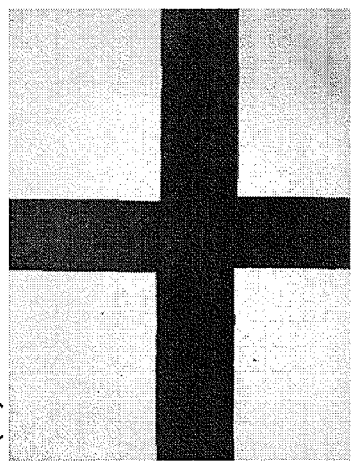
Figure 18:
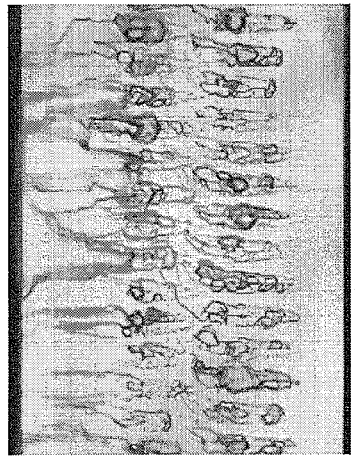
Figure 19:
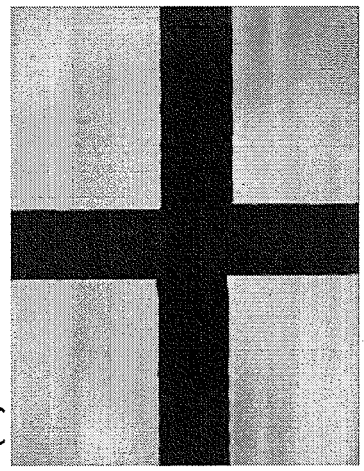
FIG. 19 is a view illustrating photographs of a surface and cut sections of the object after division in the case of condition 10 in Table 1.
Figure 19:
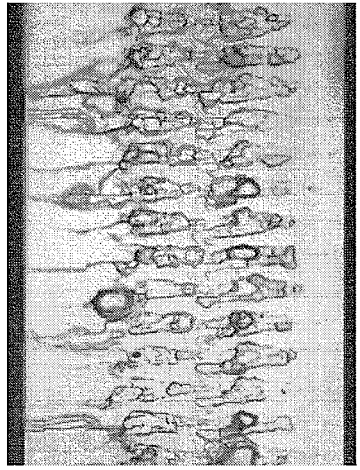
Figure 19:
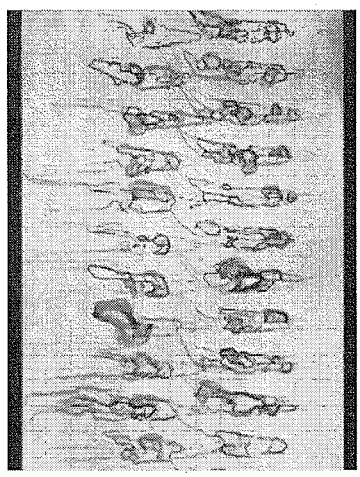
Figure 20:
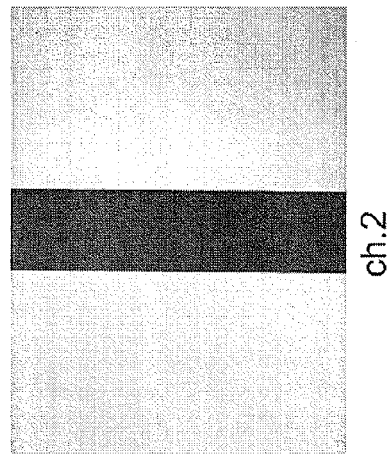
FIG. 20 is a view illustrating photographs of a surface and cut sections of the object after division in the case of condition 11 in Table 1.
Figure 20:
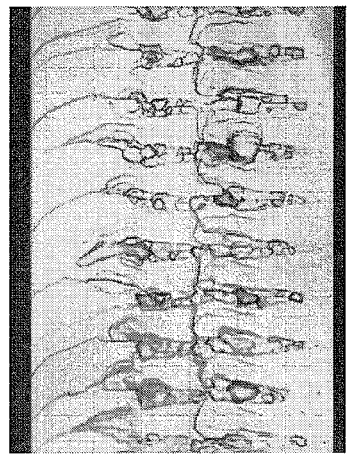
Figure 20:
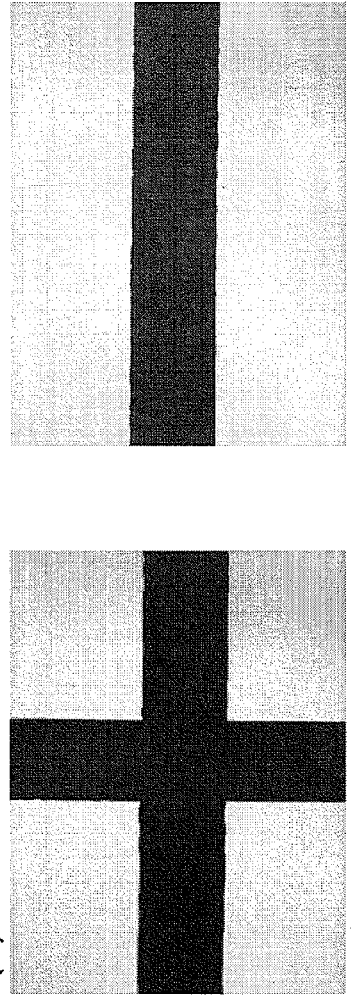
Figure 20:
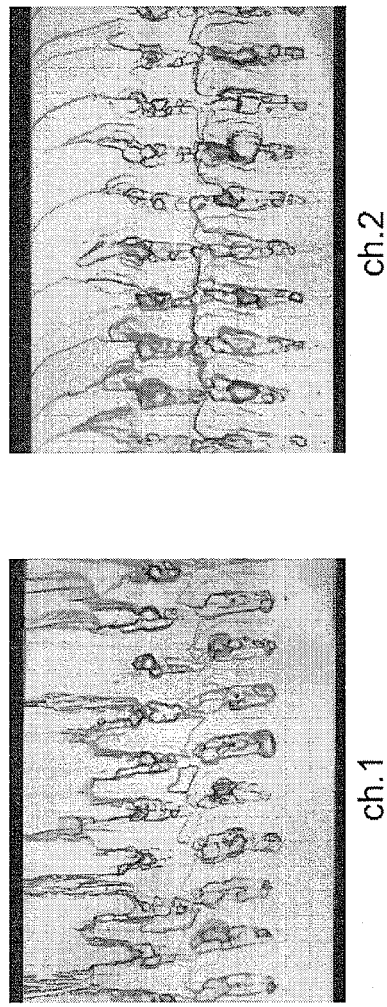

FIG. 14 is a graph illustrating relationships between the pulse width and division ratio when laser processing methods in accordance with examples and comparative examples were performed, while FIG. 15 is a graph illustrating relationships between the pulse pitch and division ratio when laser processing methods in accordance with examples and comparative examples were performed. As clear from Table 1 and FIGS. 14 and 15, the division ratio exceeds 90% when modified regions are formed by irradiation with pulsed laser light at a pulse width of 31 to 54 ns and a pulse pitch of 7.5 to 10 µm.

FIGS. 16 to 20 are views illustrating photographs of a surface and cut sections of the object after division under conditions 7 to 11 of Table 1. In the modified regions illustrated in FIGS. 17 to 19 (i.e., modified regions whose division ratio exceeded 90%), unlike those illustrated in FIGS. 16 and 20, the fractures starting from the forming of modified regions and contributing to cutting are accurately formed on a surface on a side opposite to the laser light entrance surface.

The present invention is not limited to the above-mentioned embodiment.

For example, though the front face 3 of the object 1 is used as the laser light entrance surface, the rear face 21 of the object 1 may be employed as the laser light entrance surface. When the rear face 21 of the object 1 is employed as the laser light entrance surface, the object 1 is cut into a plurality of semiconductor chips 25 as follows, for example. That is, a protective tape is attached to the front face of the functional device layer 16, and is secured to the support table of the laser processing apparatus while protecting the functional device layer 16. Then, the object 1 is irradiated with the laser light L while using its rear face 21 as the laser light entrance surface and locating the converging point P within the object 1, so as to form the modified regions 7 in the GaAs substrate 12 along the lines to cut 5. Subsequently, the protective tape secured to the support table is released therefrom together with the object 1. Thereafter, the expandable tape 23 is attached to the rear face 21 of the object 1, the protective tape is peeled off from the front face of the functional device layer 16, and then the object 1 is cut along the lines to cut 5 from the modified regions 7 acting as starting point regions for cutting while the expandable tape 23 is in an expanded state.

INDUSTRIAL APPLICABILITY

The present invention can form a modified region having a high function as a starting point region for cutting in a planar object to be processed comprising a GaAs substrate.

The invention claimed is:
1. A laser processing method including:
irradiating a planar object to be processed comprising a GaAs substrate with laser light;
locating a converging point within the object, so as to form a modified region,
wherein said modified region is formed to become a starting point region for cutting in the GaAs substrate along a line to cut the object,
wherein the laser light is pulsed laser light having a pulse width of 31 to 54 ns, and
wherein the laser light has a pulse pitch of 7.5 to 10 µm.
2. A laser processing method according to claim 1, wherein, after forming the modified region, the object is cut along the line to cut from the modified region acting as a start point.
3. A laser processing method according to claim 1, wherein the modified region includes a molten processed region.

* * * * *

UNITED STATES PATENT AND TRADEMARK OFFICE
CERTIFICATE OF CORRECTION

PATENT NO.       : 8,420,507 B2
APPLICATION NO.  : 12/670029
DATED            : April 16, 2013
INVENTOR(S)      : Masayoshi Kumagai Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 421 days.

Signed and Sealed this

First Day of September, 2015

Michelle K. Lee
*Director of the United States Patent and Trademark Office*